(12) United States Patent
Kruit et al.

(10) Patent No.: US 6,670,611 B1
(45) Date of Patent: Dec. 30, 2003

(54) ELECTRON MICROSCOPE

(75) Inventors: Pieter Kruit, Delft (NL); Hindrik Willem Mook, Den Haag (NL)

(73) Assignee: Technische Universiteit Delft, Delft (NL)

(*) Notice: Subject to any disclaimer, the term of this patent is extended or adjusted under 35 U.S.C. 154(b) by 0 days.

(21) Appl. No.: 09/786,064

(22) PCT Filed: Aug. 27, 1999

(86) PCT No.: PCT/NL99/00535
§ 371 (c)(1),
(2), (4) Date: May 30, 2001

(87) PCT Pub. No.: WO00/13200
PCT Pub. Date: Mar. 9, 2000

(30) Foreign Application Priority Data

Aug. 28, 1998 (NL) ............................................. 1009959

(51) Int. Cl.[7] .............................................. H01J 37/244
(52) U.S. Cl. ........................ 250/310; 250/288; 250/452
(58) Field of Search ......................................... 250/305

(56) References Cited

U.S. PATENT DOCUMENTS 6,184,524 B1 * 2/2001 Brink ......................... 250/305

FOREIGN PATENT DOCUMENTS

WO     WO 98 06125     2/1998

OTHER PUBLICATIONS

Mook, H.W., et al., "Electrostatic In–Line Monochromator for Schottky Field Emission Gun," *Inst. Phys. Conf.*, paper presented at Electron Microscopy and Analysis Group Conf. EMAG97, Cambridge 19997 (pp 81–84).

* cited by examiner

Primary Examiner—John R. Lee
Assistant Examiner—Phillip A Johnston
(74) Attorney, Agent, or Firm—Jeffrey D. Myers

(57) ABSTRACT

Electron optical aberrations of an energy filtering system of an energy filtering transmission electron microscope (EFTEM) are automatically corrected under computer control to set up the EFTEM for use. Optics of the electron microscope preceding an energy filter are used to scan the beam at the entrance to the filter in a pattern corresponding to a defined geometry. The beam can either be finely focused to yield a spot at each position visited during the pattern scan, or the beam can be spread out and imprinted with a well-defined intensity distribution, such as normally occurs due to passage of the beam through a specimen, so that its relative scanned displacements can be assessed using cross-correlation techniques. In the case of the finely focused beam, electron images of the scanned pattern directly yield a spot pattern image. Deviation of the recorded spot pattern image from the defined scan geometry reflect the imaging aberrations introduced by the energy filter. In the case of the spread out beam, post-filter electron images of the scanned beam are cross-correlated with an image of the beam taken without scanning yielding cross-correlation peak images that give the effective displacement of each scanned beam position due to the aberrations/distortions of the filter. Summing the cross-correlation peak images again yields a spot pattern image that is equivalent to that obtained in the focused beam case. Deviations of the recorded spot pattern image from the defined scan geometry are analyzed to assess and subsequently correct aberrations introduced by the energy filter.

16 Claims, 4 Drawing Sheets

ELECTRON MICROSCOPE

Figure 1:
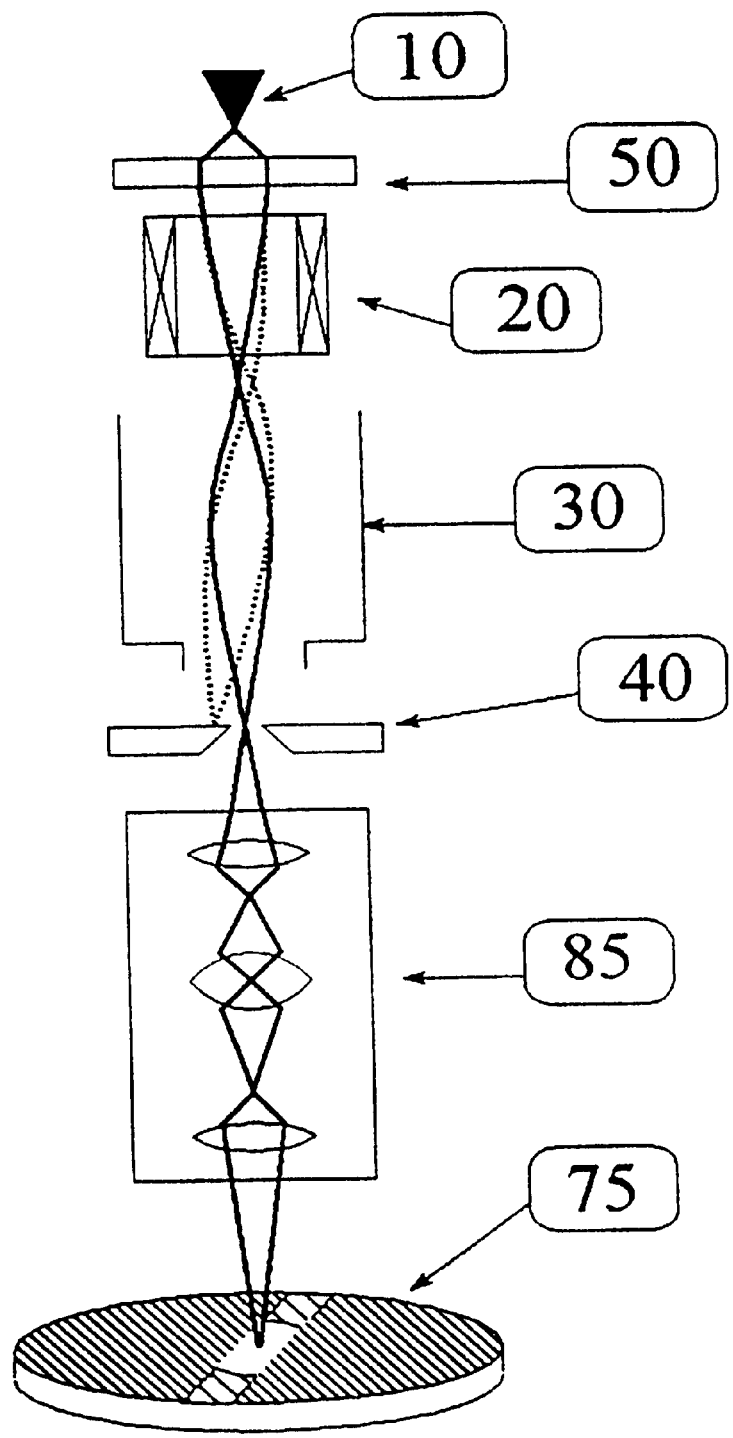

The invention relates to an electron microscope provided with an electron source for the generation of a beam of electrons; an energy-dispersive element for the dispersion of the paths of electrons having a different kinetic energy; an accelerating tube for the acceleration to a predetermined beam energy of the electron beam from the electron source to a specimen to be studied with the aid of an electron microscope; a plate mounted between the energy-dispersive element and the specimen, in which a selection slit is provided at right angles to the dispersive direction of the dispersive element for the selection of dispersed electrons having a kinetic energy within a desired energy interval; and source imaging electron optics for obtaining an image of a source in the plane of the plate comprising the selection slit.

Such an electron microscope is known from practice. Generally speaking, with an electron microscope it is possible to see smaller structures than is possible with light, making use of the wave characteristics of the electrons to produce an image of the specimen, and of the extremely short wavelength of the electrons, allowing the observance of the small structures. An electron microscope further makes it possible to analyze the specimen by determining the transmission of electrons through the specimen. It is also possible to analyze the specimen by measuring the energy loss of the electrons after they have passed through the specimen. In general this energy loss is an extremely small fraction of the kinetic energy of the electrons in the beam. When using this method of determining the energy loss, it is possible to scan the specimen with a sharply defined electron beam by means of a point by point analysis of the specimen. The smaller the diameter of the beam on the specimen, the better the resolution of the analysis. The above summary is not exhaustive but merely gives an impression of the possibilities and the great importance of an electron microscope. For the various possibilities diverse types of electron microscopes, such as the transmission electron microscope (TEM) and the scanning electron microscope (SEM), have been developed.

The demands on the analytical properties and the spacial resolution of the various electron microscopes are continuously increasing. A possibility of improving them is to introduce an energy-dispersive element in the beam's path from the electron source to the specimen. This makes it possible to reduce the electron's energy dispersion in the beam, which dispersion is mainly caused by the different velocities with which the electrons leave the electron source. The reduction of this energy dispersion makes it possible to not only increase the energy resolution of energy loss spectra to be determined, but also to improve the spacial resolution of the microscope, since the setting parameters of the electron optics used will only be optimal for a specific kinetic energy of the electrons. To operate the electron microscope properly, the setting parameters have to be aligned optimally.

One difficulty when using the energy-dispersive element is that faulty imaging of the electron source may occur. For example, an astigmatic image may be formed, which means that there are different focusing planes for the dispersive and the non-dispersive direction of the dispersive element. The image of the electron source has to lie in the plane of the plate with the selection slit which is ultimately used for the selection of the electron beam's appropriate energy interval. Such a plate may, for example, consist of two plate halves between which the slit is formed. In order to render the image stigmatic, it is possible to add a so-called stigmator to the source imaging electron optics. Such a stigmator may be integrated with the energy-dispersive element. To make the image stigmatic and to focus it in the plane of the plate comprising the selection slit, the setting parameters of the stigmator and a number of other elements of the source imaging electron optics also have to be optimized.

The specific embodiments of the various elements applied will not be entered into. Such elements are known in the electron microscopy and they use setting voltages and currents as setting parameters.

The optimization of these setting parameters poses a problem with the known electron microscope. When aligning this microscope, the electron source is imaged as well as possible in the plane of the selection slit, and a magnified image is subsequently projected onto the fluorescence screen of the electron microscope. However, it is not possible to assess whether the source is imaged properly in the plane of the selection slit, as this image is observed via a further image on the fluorescence screen. Another disadvantage is that the electron microscope's magnifying optics for imaging the first image on the fluorescence screen have to be aligned separately, which is time consuming and cannot be carried out automatically.

It is the object of the invention to provide an electron microscope of which the setting parameters in respect to various optical elements for the electron beam can be aligned fully and efficiently. To this end the invention provides an electron microscope, characterized in that in addition to the selection slit, the plate comprises a plurality of further apertures useful for the determination of the cross-sectional form of the beam; and in that the electron microscope comprises means for the determination of the intensity of the beam being transmitted through and/or onto the plate so that subject thereto, setting parameters of the energy-dispersive element and the source imaging electron optics can be aligned.

The apertures in the plate allow the beam to pass in a particular crosswise direction with respect to the direction of the beam, with the shape of the apertures having to be such that the beam's intensity can be determined in different cross directions. Said transmitted beam intensity can be measured by the means mentioned, so that said intensity coupled to a particular direction is known. In this manner immediate information is obtained regarding the dimensions and the position of the image in the plane comprising the selection slit. This is extremely important for the precise alignment of the setting parameters for obtaining an optimal image of the electron source in the plane of the selection slit.

The invention further provides the advantage that the optimization of the setting parameter can be performed automatically by interposing a calculation and control unit with an algorithm controlling the setting parameters in accordance with the particular beam intensities. An automatic optimization process further contributes to obtaining an optimal and quick alignment of the various setting parameters.

Preferably the membrane is positioned directly after the energy-dispersive element and the source imaging electron optics. This manner of positioning produces an image on the membrane that is not influenced by elements that do not need to be optimized, which results in the most precise alignment.

In a preferred embodiment the electron microscope is characterized in that the dimensions of the apertures are in the nanometric range; and in that the plate constitutes a thin membrane placed at a position where the electron's kinetic energy is so low that it can be blocked by the thin membrane.

Such small structures ensure that the obtained information relating to the location of the image in the plane of the selection slit has a high resolution, which further contributes to an extremely precise optimization. With such small structures it is necessary that the membrane they are made into is thin, having a thickness in the order of the dimensions of the apertures. Too thick a plate results in long and narrow channels through the plate. Such channels cause electrons to be scattered on their walls, which must be avoided as much as possible to prevent imaging problems.

It should be noted that from a contribution by the inventors at the EMAG '97 conference (Electron Microscopy Analysis Group Conference, Cambridge, UK, 1997) placing a membrane having a narrow slit directly after an energy-dispersive element is already known. However, the considerations that culminated in the present invention of applying apertures with dimensions in the nanometric range and placing them directly after the elements to be optimized, are specific for the optimization of the alignment of their setting parameters.

To facilitate the alignment, a favourable embodiment is characterized in that the plate is permanently positioned, and in that the source imaging electron optics comprise at least one deflection means allowing the electron paths to be deflected in both the dispersive direction of the dispersive element and a direction perpendicular thereto. Such an embodiment is especially suitable for automatization.

The different apertures may have various shapes. In a preferred embodiment the further apertures comprise at least one additional slit at an angle with the selection slit, so that the intensity of the beam can also be determined in the dispersive direction, for instance, to make it possible for the image in the non-dispersive direction to also be projected in the plane of the selection slit.

In order to be able to determine the form of the beam in the dispersive direction only, the additional apertures comprise at least one slit parallel to the dispersive direction of the dispersive element.

For the composition of different configurations of slits the additional apertures comprise at least one slit parallel to the selection slit. A number of slits may be arranged in a star shape with the beam during optimization being able to move about the centre point of said star configuration, and in a pattern comprising at least one rectangle.

The other apertures further comprise preferably at least one opening much smaller than the cross-sectional dimension of the electron beam so that an exact image of the beam can be obtained, and so that only a small part of the image of the electron source is available when measuring specimens, while the edge effects of the source are blocked.

At the same time, the other apertures may comprise at least one opening which is much larger than the cross-sectional dimension of the electron beam in order to allow the whole beam to pass, or in order to obtain a slowly integrating signal when the beam is being moved from the plate into the opening.

In a preferred embodiment similar apertures are provided having different dimensions, so that openings can be selected whose dimensions, for example the width of the slit, match a desired energy interval or whose dimensions correspond with the size of the image of the electron source, to obtain a transmitted beam of maximum brightness.

In possible embodiments of the electron microscope according to the invention, the means for the determination of beam intensity transmitted through and/or onto the plate comprising the apertures include a current detector which, viewed in the direction of the beam, is placed after the plate and connected thereto is a current meter for measuring the electrons passing through the apertures; and/or a current detector which, viewed in the direction of the beam, is placed before the plate and connected thereto is a current meter for measuring the electrons reflected by the plate; and/or a current detector connected with the plate for measuring the incidence of electrons onto the plate, but not reflected by the plate.

Figure 2:
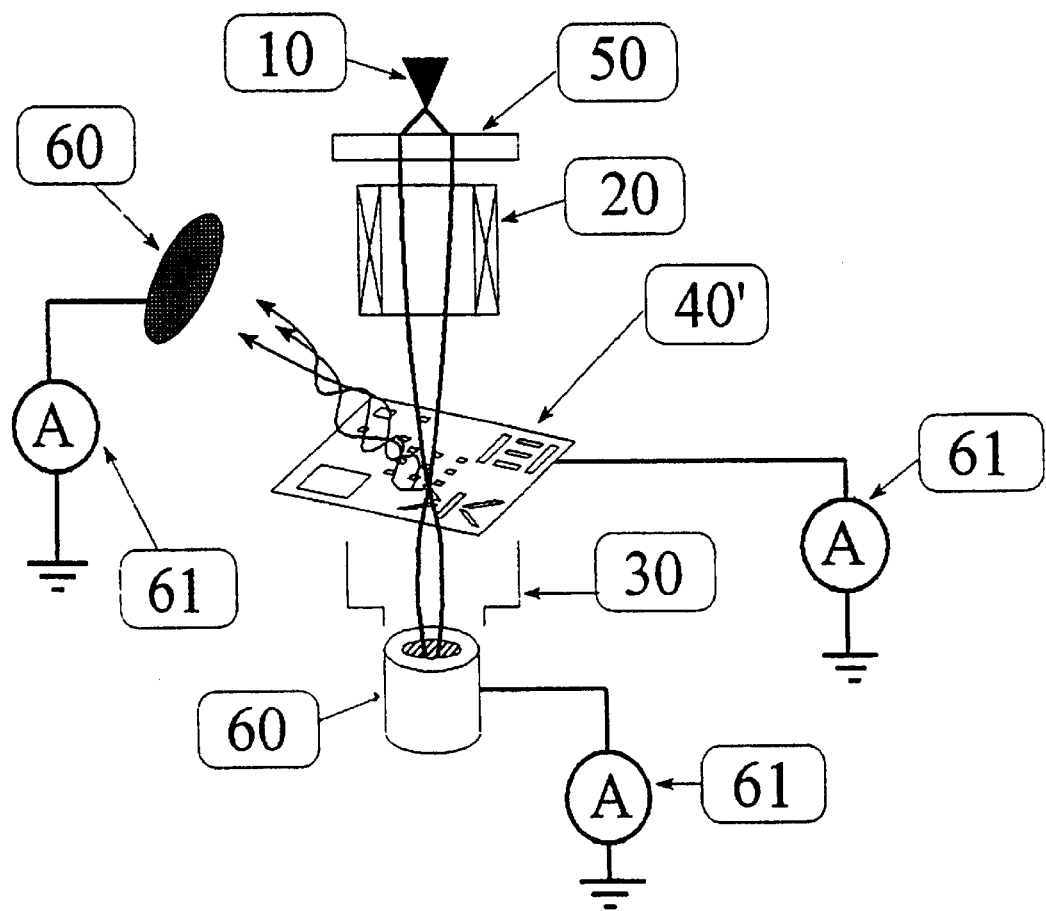
Figure 3:
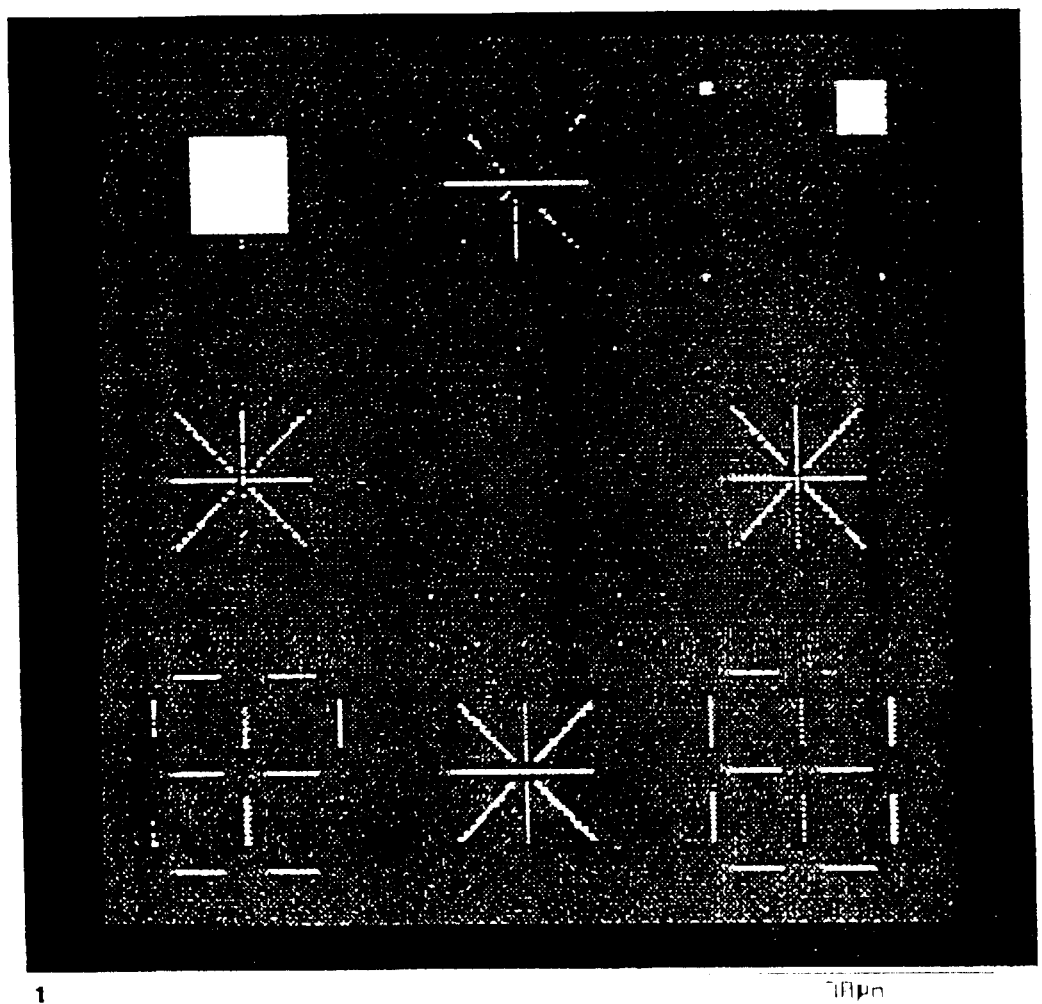
Figure 4:
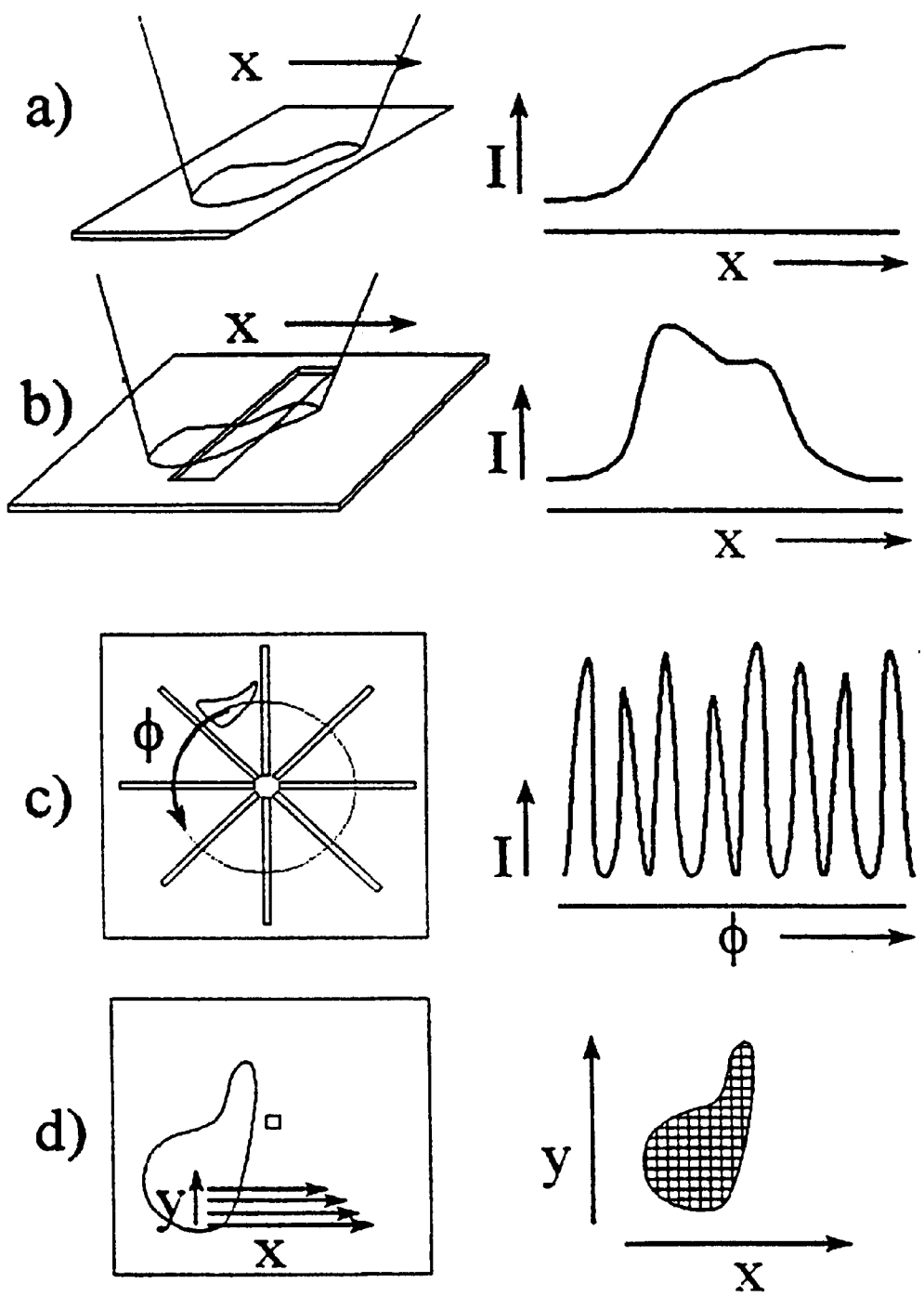

The invention will be explained in more detail with reference to the appended drawings in which identical parts are indicated by the same reference numbers, and in which FIG. 1 shows an electron microscope according to the prior art, wherein imaging of the electron source is schematically indicated on successively the selection slit and the fluorescence screen;

FIG. 2 shows an electron microscope according to the invention, wherein imaging of the electron source on a membrane comprising the apertures is schematically indicated;

FIG. 3 shows an electron microscopic image of a membrane comprising the apertures of nanometric dimensions, as used in a preferred embodiment of the electron microscope according to the invention; and FIGS. 4a to 4d show different measured intensity profiles, as shown on the right-hand side of the Figures, during scanning of the electron beam over the different apertures of the membrane shown in FIG. 3, as shown on the left-hand side of the Figures.

The electron microscopes shown in the FIGS. 1 and 2 comprise an electron source 10. This may be formed by a Schottky field emission source, having an extremely small effective source capacity which is typically approximately 50 nm (nanometre). The electrons leaving the source possess a certain range in the kinetic energy, which range is for the Schottky source typically 0.4–0.9 eV (electron-volt).

The spacial resolution of the electron microscope is limited among other things by chromatic aberration, that is to say that the imaging characteristics of the microscope depend on the specific energy of the electrons in the electron beam. When imaging, all the energies within the energy dispersion of the electron beam will form images in different places which, if high spacial resolution is desired, must be prevented. Further, energy dispersion in the electron beam is also disadvantageous when making an analysis wherein the energy loss is determined by electrons that have passed through a specimen (not shown). The energy resolution that can be attained in such an analysis will also depend on the energy dispersion in the beam.

In order to limit this dispersion of the electrons' kinetic energy in the beam, an energy-dispersive element 20 is provided between the electron source 10 and the specimen. Since the energy-dispersive element 20 is the most effective when the kinetic energy of the electrons is low, this element 20 is located in the vicinity of the electron source 10, because the electrons are eventually accelerated to a voltage of approximately 1 keV (kiloelectron-volt) or considerably higher (for example 400 keV). To this end the specimen is placed on an electric potential with a relatively low absolute value, and the electron source on a high negative electric potential, and the electrons are accelerated in an interposed acceleration tube 30. The energy-dispersive element 20 will then also be positioned at this high negative electric potential, in order not to or only slightly to accelerate the electrons between the electron source 10 and the dispersive element 20, and to keep the kinetic energy of the electrons in the dispersive element 20 low. For the final selection of a desired energy interval, a plate 40 comprising a selection slit has been placed between the energy-dispersive element 20 and the specimen, to allow the transmission of electrons having a desired kinetic energy. In general the plate 40 is placed at the end of the acceleration tube 30 at an electric potential with a relatively low absolute value, so that it can be manipulated, for example, to facilitate the alignment of the width of the selection slit of a plate 40 consisting of two different halves between which the selection slit is formed.

Further, electron optics 50 have been provided near the electron source 10 for imaging the electron source 10 in the plane of the plate 40 comprising the selection slit. In the ideal case, due to the energy-dispersive element 20, the different paths of electrons having different kinetic energies will form different images, but in the plane of the plate 40. At the same time, however, the use of the energy-dispersive element 20 causes astigmatic focusing, which means that the images in the dispersive and the non-dispersive direction of the energy-dispersive element 20 are formed in different, successive planes. This results in a limitation of the spacial resolution of the electron microscope. The astigmatic focusing can be cancelled by means of adding a so-called stigmator to the electron optics of the microscope. Such a stigmator is not separately shown, but in the embodiments according to the FIGS. 1 and 2 it is incorporated in the electron optics 50. The electron optics 50 comprising the stigmator can also be embodied as a whole with the energy-dispersive element 20, wherein an energy-dispersive element 20 embodied as Wien-filter may be provided with different electric and magnetic multipoles, so as to simultaneously serve as focusing element.

The above-mentioned optical elements of the electron optics 50 and the energy-dispersive element 20 are known, and as such are not part of the present invention. They will not be discussed further. Important is, however, that these optical elements must be aligned so that an optimal setting can be obtained for them and consequently for the electron microscope. To this end said optical element's setting parameters formed by setting voltages and currents require optimal alignment.

The prior art electron microscope according to FIG. 1 achieves this with the aid of magnifying optics 85, whereby a magnified image of the electron source 10 on the plate 40 comprising the selection slit, is projected onto the fluorescence screen 75. Thus the image on the plate 40 is not observed directly, but indirectly. This makes it extremely difficult to determine whether the electron source 10 is imaged exactly in the plane of the plate 40. Likewise, it is hardly possible to achieve an optimal setting for the electron microscope based solely on viewing the image on the fluorescence screen 75, and it is a very painstaking process.

The electron microscope according to the invention shown in FIG. 2, solves this problem by means of a plate 40 comprising the selection slit and a plurality of additional apertures providing information with regard to the cross-sectional shape of the electron beam. In the preferred embodiment shown, the plate 40 is a membrane 40' comprising apertures with dimensions in the nanometric range (nano-structures) for the provision of information with a high spacial resolution. Further, the membrane 40' is positioned directly after the optical elements whose setting parameters have to be aligned when optimizing. It is now possible to optimize said parameters independently of the rest of the microscope.

Using known lithographical techniques, the nano-structures can be etched into a 100 nm-thick membrane of silicon nitride ($Si_3N_4$). This membrane layer is placed on a silicon wafer into which an opening of 0.1×0.1 mm (millimetre) was etched to completely lay bare the membrane in this section. Both sides of the silicon wafer are thinly coated with platinum to aid the conduction of electrons from the electron beam falling onto the silicon wafer and the membrane. After the various operations, the silicon wafer is broken into pieces of 2.5×2.5 mm, and such a piece is subsequently mounted into the electron microscope. FIG. 3 shows the various structures that are etched in a preferred embodiment of the membrane 40'. Later on these structures will be further elucidated in connection with FIG. 4.

The intensity of the beam transmitted through the nano-structures and onto the membrane can be measured with the aid of the current detectors 60 and current meters 61 shown in FIG. 2. Involved in this case are, among other things, a current detector 60 and current meter 61 for electrons transmitted through the nano structures. In the embodiment shown the intensity is not spacial-resolution measured. This does become a possibility by using a two-dimensional detector. In addition, a current meter 61 is shown for measuring the incidence of electrons on the membrane 40' that are not reflected, and a current detector 60 and current meter 61 for measuring the incidence of electrons on the membrane 40', that are reflected.

With the aid of a computer the currents measured with the different current meters 61 can be read out simultaneously and thus be correlated. Scanning the beam over the nano-structures can also take place computer-controlled. By using a suitable computer program-implemented algorithm and standard control means it is possible to automate the entire optimization process. Such control means and a computer are not shown in the Figures, but the person skilled in the art will be familiar with these.

In order for the beam to scan over the nano-structures, the electron beam has to be deflected into a direction approximately perpendicular to the direction of the beam. This can be achieved through the integration of deflectors in the electron optics 50. Such deflectors are known as such. It is possible to use a dispersive element 20 acting as deflector, to scan the beam in its dispersive direction.

The nano-structures shown in FIG. 3 are large openings for the unimpeded transmission of the electron beams when, for example, the dispersive element 20 is switched off, or when switching-on the source, the same is not yet properly focused and only the large openings transmit enough electrons for the beam to be detectable. The large rectangular or square openings may further be used for so-called "sharp-edged" measurements, wherein the beam is scanned over the edge of the opening. When scanning the beam from the membrane into the opening, the integral beam intensity gradually increases. After differentiation of such a measurement, this results in the beam intensity in the scanning direction of the beam. Such a "sharp-edged" measurement is schematically illustrated in FIG. 4a, showing on the left-hand side in perspective the beam on the membrane using a large opening, and indicating the scanning direction. On the right-hand side in FIG. 4a the intensity gradient I is given as a function of the scanning direction x.

It goes without saying, that there are also selection slits arranged perpendicularly to the dispersive direction of the energy-dispersive element 20 for the selection of a desired energy interval of the beam to be transmitted. With the aid of said slits, it is possible to determine the transmitted beam intensity perpendicularly to the dispersive direction. There are also slits parallel to the dispersive direction for the determination of the beam intensity in the dispersive direction. The scanning of a beam over the a slit in the direction x is schematically in perspective illustrated on the left-hand side in FIG. 4b; on the right-hand side in FIG. 4d the respective measured intensity gradient I can be seen.

The different lengths of the apertures can be calibrated simply with the aid of the structures shown, which are arranged in a pattern consisting of various rectangles in which the slits stand at right angle to one another. These right-angular structures allow the direct measurement of the image in a particular direction.

When the beam is moved about the centre of the star-shaped structure, said star-shaped structures allow the size and quality of the image to be measured in different directions. By means of the eight-point star shown here, a cross section through the beam can be obtained in three 45°-degree directions. Of course, star shapes comprising more directions may also be applied. Scanning of the beam over the eight-point star shape and the respective intensity gradient I as a function of the scanning angle φ, are shown in FIG. 4c on the left- and right-hand side, respectively.

In addition there are openings present of a size much smaller than the dimension of the cross section of the beam for obtaining a precise image of the beam. Such a measurement with respective intensity gradient is shown in FIG. 4d. The intensity is here shown in a shade of grey as a function of two scanning directions x and y at right angles to one another. This kind of measurement is, however, relatively time consuming.

It is also possible to use a small opening to obtain a "clean" filtered beam. Frequently an electron source exhibits weak emission at the edges of the emission area; this may spoil sensitive measurements. A small opening allows such emission edges to be removed also in non-dispersive directions.

Some of the various apertures have different dimensions. For obtaining optimal brightness, it is thus possible both to select a dimension to match the dimension of the electron source and an energy interval that depends on the width in the dispersive direction.

The embodiments described above are not to be considered to limit the invention. Within the scope of the present invention and the appended claims the electron microscope may be realized in a variety of embodiments which all fall within the invention's scope of protection.

What is claimed is:

1. In an electron microscope provided with an electron source for generation of a beam of electrons;
   an energy-dispersive element for dispersion of paths of electrons having a different kinetic energy;
   an accelerating tube for acceleration to a predetermined beam energy of an electron beam from the electron source to a specimen to be studied with aid of an electron microscope;
   a plate mounted between the energy-dispersive element and the specimen, in which a selection slit is provided at right angles to the dispersive direction of dispersive element for the selection of dispersed electrons having a kinetic energy within a desired energy interval; and
   source imaging electron optics for obtaining an image of a source in a plane of the plate comprising the selection slit,
   an improvement wherein in addition to the selection slit, the plate comprises a plurality of further apertures useful for determination of cross-sectional form of the beam; and
   wherein the electron microscope comprises means for determination of intensity of the beam being transmitted through and/or onto the plate so that subject thereto, setting parameters of the energy-dispersive element and the source imaging electron optics can be aligned.

2. A microscope according to claim 1 additionally comprising a calculation and control unit controlling the setting parameters in accordance with particular beam intensities.

3. A microscope according to claim 1 wherein the plate is positioned directly after the energy-dispersive element and the source imaging electron optics.

4. A microscope according to claim 1, wherein dimensions of the apertures are in a nanometric range and wherein the plate comprises a thin membrane placed at a position where the electron's kinetic energy is so low that it can be blocked by the thin membrane.

5. A microscope according to claim 1, wherein the plate is permanently positioned, and in that the source imaging electron optics comprise at least one deflection means allowing the electron paths to be deflected in both the dispersive direction of the dispersive element and a direction perpendicular thereto.

6. A microscope according to claim 1, wherein the further apertures comprise at least one additional slit at an angle with the selection slit.

7. A microscope according to claim 1, wherein the additional apertures comprise at least one slit parallel to the dispersive direction of the dispersive element.

8. A microscope according to claim 1, wherein the additional apertures comprise at least one slit parallel to the selection slit.

9. A microscope according to claim 1, wherein a number of slits are arranged in a star shape.

10. A microscope according to claim 1, wherein a number of slits are arranged in a pattern comprising at least one rectangle.

11. A microscope according to claim 1, wherein the other apertures further comprise at least one opening much smaller than the cross-sectional dimension of the electron beam.

12. A microscope according to claim 1, wherein the further apertures comprise at least one opening much larger than the cross-sectional dimension of the electron beam.

13. A microscope according to claim 1, wherein similar apertures are provided having different dimensions.

14. A microscope according to claim 1, wherein the means for the determination of beam intensity transmitted through and/or onto the plate comprising the apertures include a current detector which, viewed in the direction of the beam, is placed after the plate and connected thereto is a current meter for measuring the electrons passing through the apertures.

15. A microscope according to claim 1, wherein the means for the determination of beam intensity transmitted through and/or onto the plate comprising the apertures include a current detector which, viewed in the direction of the beam, is placed before the plate and connected thereto is a current meter for measuring the electrons reflected by the plate.

16. A microscope according to claim 1, wherein the means for the determination of beam intensity transmitted through and/or onto the plate comprising the apertures include a current meter connected with the plate for measuring the incidence of electrons onto the plate, but not reflected by the plate.

* * * * *